(12) United States Patent
Ohta et al.

(10) Patent No.: US 6,284,863 B1
(45) Date of Patent: Sep. 4, 2001

(54) POLYMERS HAVING O-SUBSTITUTED VINYLPHENOL UNIT AND RESIST COMPOSITIONS CONTAINING THEM

(75) Inventors: Yoshiteru Ohta, Ibaraki; Sang-tae Kim, Toyonaka; Masumi Suetsugu, Minoo, all of (JP)

(73) Assignee: Sumitomo Chemical Company, Ltd., Osaka (JP)

( * ) Notice: Subject to any disclaimer, the term of this patent is extended or adjusted under 35 U.S.C. 154(b) by 0 days.

(21) Appl. No.: 09/559,966

(22) Filed: Apr. 28, 2000

(30) Foreign Application Priority Data

Apr. 30, 1999 (JP) .................................................. 11-124526
Jul. 7, 1999 (JP) .................................................. 11-193362

(51) Int. Cl.[7] .......................... C08G 65/38; C08F 116/06; C08F 16/06; C08F 216/06
(52) U.S. Cl. .......................... 528/215; 528/205; 528/211; 528/212; 525/191; 525/242; 525/328.8
(58) Field of Search ..................... 528/215, 205, 528/211, 212; 525/191, 242, 328.8

(56) References Cited

U.S. PATENT DOCUMENTS 5,585,218    12/1996   Nakano et al. .

FOREIGN PATENT DOCUMENTS 0827025    3/1998   (EP) .
2320500    6/1998   (GB) .
10254135   9/1998   (JP) .

*Primary Examiner*—Duc Truong
(74) *Attorney, Agent, or Firm*—Birch, Stewart, Kolasch & Birch, LLP

(57) ABSTRACT

A polymer having an O-substituted vinylphenol unit represented by the following formula (I)

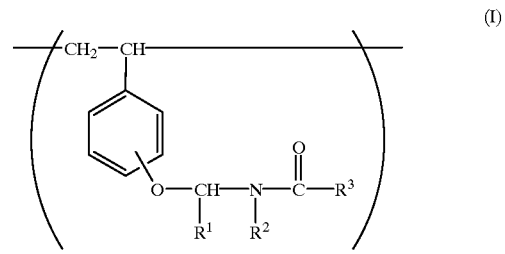

wherein $R^1$, $R^2$ and $R^3$ represent an alkyl; or $R^1$ and $R^2$, $R^1$ and $R^3$ or $R^2$ and $R^3$ are bound together and respectively form an alkylene; or $R^2$ is methylidyne wherein one bond in the methylidyne is bound to $R^1$, the other bond is bound to $R^3$, and $R^1$ and $R^3$ represent alkylene, and a resist composition comprising the polymer are provided.

17 Claims, No Drawings

POLYMERS HAVING O-SUBSTITUTED VINYLPHENOL UNIT AND RESIST COMPOSITIONS CONTAINING THEM

BACKGROUND OF THE INVENTION

The present invention relates to polymers having O-substituted vinylphenol unit which is usable as a component of resist, and to resist compositions containing them.

In recent years, quarter-micron pattern formations have been demanded with the increase in the integration level of semi-conductor integrated circuits. Particularly, the eximer laser lithography has attracted attention because it enables producing 64 M to 1G DRAM (dynamic random access memory). As a resist suitable for such eximer laser lithography process, a resist utilizing the chemical amplification effects of an acid catalyst, generally called chemical amplification type resist, has been proposed and is putting in the practical use. For example, in the negative working chemical amplification type resist, an acid is generated from an acid generator by the action of high-energy radiation such as electromagnetic waves, and the solubility of a part exposed to a high-energy radiation of an alkali-soluble resin in an alkaline developing solution is reduced by cross-linking and hardening by the action of the generated acid and a cross-linking agent. On the other hand, the acid does not generate in a part that is not exposed to a high-energy radiation and thus the solubility in the alkaline developing solution is maintained. By such a mechanism, a negative working pattern is obtained by a series of treatments, i.e., a formation of a resist film, an irradiation for patterning and an alkaline development.

Conventionally, polyvinylphenol has been used in most cases as a resin for a chemical amplification type resist. Since, however, polyvinylphenol has a too high solubility in alkaline developing solutions, they have a problem that the sensitivity and the resolution are insufficient. In order to resolve such a problem, use of a polyvinylphenol in which phenolic hydroxyl groups are partly converted to alkyl ethers have been disclosed in JP-A-7-295220 and JP-A-10-69082.

While the use of a polyvinylphenol in which phenolic hydroxyl groups are partly converted to alkyl ethers allows improvement in the sensitivity and the resolution, there is a limit of about 0.22 μm for the resolution particularly of negative working resists. Therefore, improvement has been demanded in this respect. In addition, there is a demand for improvement in the profile (shape of pattern). Moreover, the facts are naturally required that the performance is not changed by the variation of period from the time of coating and drying a resist solution on a substrate to the time of exposing to rays., in other words, the storage stability after coating and before light-exposure is excellent; and that a change in the performance is not significant during a long term storage of a resist composition itself, in other words, the storage stability of the resist composition itself is acceptable.

The purpose of the present invention is to provide a novel polymer which gives an excellent resolution and profile when used as a resin component in a resist composition and gives an acceptable result for the sensitivity, film-forming rate, the coating property, the storage stability after coating and before light-exposure and the storage stability of resist composition itself. The purpose of the present invention is also to provide a resist composition having an excellent performances as described above, using such polymer. As the result of extensive studies for attaining such a purpose, the present inventors have successfully completed the present invention.

SUMMARY OF THE INVENTION

The present invention provides a polymer having an O-substituted vinylphenol unit represented by the following formula (I)

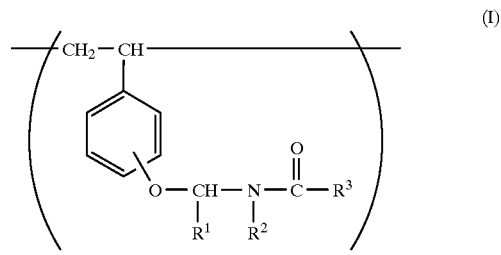

wherein $R^1$, $R^2$ and $R^3$ independently represent an alkyl, having 1 to 4 carbon atoms, which may be optionally substituted: or $R^1$ and $R^2$, $R^1$ and $R^3$ or $R^2$ and $R^3$ are bound together and respectively form an alkylene, having 2 to 9 carbon atoms, which may be optionally substituted; or $R^2$ is methylidyne wherein one bond in the methylidyne is bound to $R^1$, the other bond is bound to $R^3$, and $R^1$ and $R^3$ independently represent alkylene., having 2 to 9 carbon atoms, which may be optionally substituted.

The present invention also provides a resist composition comprising such a polymer as a resin component.

DETAILED DESCRIPTION OF THE INVENTION

In the formula (I) described above, when $R^1$ and $R^2$ are bound together and form an alkylene. The O-substituted vinylphenol unit of the formula (I) can specifically be represented by the following formula (Ia). When $R^1$ and $R^3$ are bound together and form an alkylens, the O-substituted vinylphenol unit of the formula (I) can specifically be represented by the following formula (Ib). When $R^2$ and $R^3$ are bound together and form an alkylene, the O-substituted vinylphenol unit of the formula (I) can specifically be represented by the following formula (Ic). When $R^2$ is methylidyne and one bond in the methylidyne is bound to $R^1$, the other bond is bound to $R^3$, and $R^1$ and $R^3$ represent an alkylene respectively, the O-substituted vinylphenol unit of the formula (I) can specifically be represented by the following formula (Id):

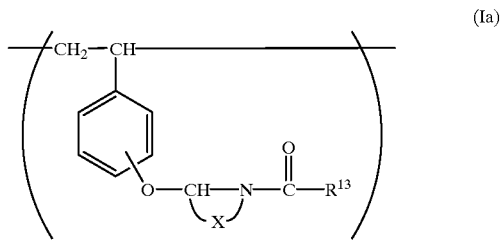

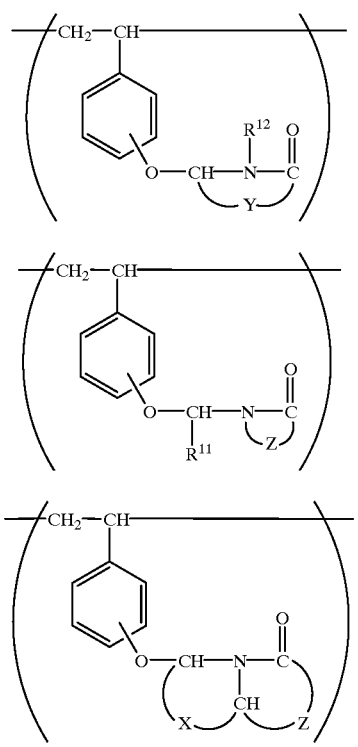

wherein $R^{11}$, $R^{12}$ and $R^{13}$ independently represent an alkyl, having 1 to 4 carbon atoms, which may be optionally substituted; and X, Y and Z independently represent an alkylene, having 2 to 9 carbon atoms, which may be optionally substituted.

The polymer of the present invention may be either a homopolymer substantially consisting of O-substituted vinylphenol unit represented by the above formula (I) alone, or a copolymer having, together with the above unit, another unit derived from any vinyl compound. It is advantageous that another unit is a vinylphenol unit, namely a unit represented by the following formula (II):

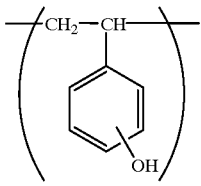

In the formula (I), the group —OCH($R^1$)N($R^2$)COR$^3$ may be bound to anyone of o-position, m-position and p-position in benzene ring which is a pendant on the main chain of the polymer. Generally, it is bound to p-position because of the availability of raw material.

When $R^1$ and $R^2$, $R^1$ and $R^3$ or $R^2$ and $R^3$ in the formula (I) are bound together and respectively form an alkylene having 2 to 9 carbon atoms, or when $R^2$ in the formula (I) is methylidyne wherein one bond In the methylidyne is bound to $R^1$, the other bond is bound to $R^3$, and $R^1$ and $R^3$ respectively form an alkylone having 2 to 9 carbon atoms, the alkylene may be polymethylene of straight chain or may be a branched chain. Therefore, X, Y and Z in the formulae (Ia), (Ib) or (Ic) and X and Z in the formula (Id) may also be polymethylene of straight chain or may be a branched chain. Polymethylene has usually about 2 to 5 carbon atoms.

Examples of the group which may be a substituent on alkyl represented by $R^1$, $R^2$ or $R^3$ in the formula (I), or on alkylene formed by $R^1$ and $R^2$, $R^1$ and $R^3$ or $R^2$ and $R^3$ in the formula (I), i.e. alkylene represented by X, Y and Z in the formulae (Ia), (Ib) or (Ic), or on alkylene formed by $R^2$ or $R^3$ when $R^2$ in the formula (I) is methylidyne wherein one bond in the methylidyne is bound to $R^1$, the other bond is bound to $R^3$, i.e. X and Z in the formula (Id), include alkoxy having 1 to 4 carbon atoms, alkoxycarbonyl wherein its alkyl part has 1 to 4 carbon atoms. acyl having 1 to 5 carbon atoms in total, and acyloxy having 1 to 5 carbon atoms in total. Specific examples of the alkoxy include methoxy, ethoxy, propoxy and butoxy, and this is also applied to specific examples of alkoxy in the alkoxycarbonyl. Specific examples of the acyl include formyl, acetyl, propionyl, butyryl, valeryl and pivaloyl, and this is also applied to specific examples of acyl in the acyloxy.

In the formula (I), preferably at least one of $R^1$, $R^2$ and $R^3$ is an alkyl as described above, more preferably unsubstituted alkyl. Particularly preferred alkyl is methyl or ethyl. The alkylene formed by binding a part or whole of $R^1$, $R^2$ and $R^3$ in the formula (I), i.e. The alkylene represented by X, Y or Z in formulae (Ia), (Ib), (Ic) and (Id), is preferably polymethylene having 3 to 5 carbon atoms, namely trimethylene, tetramethylene or pentamethylene. Among them, trimethylene or tetramethylene is more preferred.

The polymer of the present invention has an O-substituted vinylphenol unit of the above formula (I), and may be either a homopolymer substantially consisting of this unit alone, or a copolymer having plurality of kinds of unit within the range of this formula, or a copolymer having, together with one or more units encompassed in the formula (I), another unit derived from any vinyl compound. When it is a copolymer, it is preferred that the O-substituted vinylphenol unit is present in 1% by mole or more based on the total polymer.

The vinyl compound for forming a unit other than the unit of formula (I) includes aromatic vinyl compounds. unsaturated acid eaters and the like. The aromatic vinyl compounds herein are compounds having a vinyl group bound to an aromatic ring. Specific examples thereof include styrene, o-, m- or p-hydroxystyrene, o-, m- or p-methoxystyrene, o-, m- or p-ethoxystyrene, o-, m- or p-propoxystyrene, o-, m- or p-isopropoxystyrene, o-, m- or p-butoxystyrene, o-, m- or p-tert-butoxystyrene, o-, m- or p-(1-ethoxyethoxy)styrene, o-, m- or p-(1-ethoxypropoxy)styrene, o-, m- or p-(1-isobuthoxyethoxy)styrene, o-, m- or p-(2-tetrahydropyranyloxy)styrene, o-, m- or p-tert-butoxycarbonyloxystyrene, o-, m- or p-acetoxystyrene, o-, m- or p-propionyloxystyrene, o-, m- orp-pivaloyloxystyrene, o-, m- or p-benzoyloxystyrene, o-, m- or p-mesyloxystyrene, o-, m- or p-phenylsulfonyloxystyrene and o-, m- or p-tosyloxystyrene.

The unsaturated acid esters refer to various esters of carboxylic acids having an unsaturated bond such as acrylic acid, methacrylic acid, maleic acid, fumaric acid and itaconic acid. Specific examples thereof include methyl acrylate, ethyl acrylate, isopropyl acrylate, butyl acrylate, tert-butyl acrylate, cyclohexyl acrylate, phenyl acrylate, benzyl acrylate, 2-methyl-2-adamantyl acrylate, 2-ethyl-2-adamantyl acrylate, 3-hydroxy-1-adamantyl acrylate, 2-oxo-3-tetrahydrofuryl acrylate, methyl methacrylate, ethyl methacrylate, isopropyl methacrylate, butyl methacrylate, tert-butyl methacrylate, cyclohexyl methacrylate, phenyl methacrylate, benzyl methacrylate, 2-methyl-2-adamantyl methacrylate, 2-ethyl-2-adamantyl methacrylate, 3-hydroxy-1-adamantyl methacrylate, 2-oxo-3-tetrahydrofuryl methacrylate, diethyl maleate, diethyl fumarate and diethyl itaconate. In addition, various compounds having an unsaturated bond, such as maleic anhydride, 1,3-butadiene, acrylonitrile, methacrylonitrile. Vinyl chloride and vinyl acetate can be used as a vinyl monomer for leading to a structural unit other than the unit of formula (I).

Particularly, as the resin component for the resist composition, it is preferred that the copolymer contains a vinylphenol unit represented by the formula (II) described above together with the O-substituted vinylphenol unit represented by the formula (I). The position of the hydroxyl group in the vinylphenol unit may be any one of o-, m- or p-position with regard to the vinyl group. Generally used compound is p-vinylphenol in which the hydroxyl group is positioned at p-position with regard to the vinyl group. There may be further unit, such as an aromatic vinyl compound, an unsaturated acid ester or the like, in addition to the unit of the formula (I) and the vinylphenol unit of the formula (II). In such copolymer containing the unit of the formula (I) and the vinylphenol unit of the formula (II), the proportion of the vinylphenol unit in the copolymer is preferably about 50 to 95% by mole.

The polymer having an O-substituted vinylphenol unit represented by the formula (I) can be produced, for example, by the following process.

The polymer can be obtained by reacting a homopolymer of vinylphenol or a copolymer of vinylphenol and one or more species of other vinyl compounds as described above with a N-acyl unsaturated compound represented by the following formula (III):

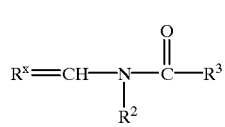
(III)

wherein $R^x$ represents an alkylidene, having 1 to 4 carbon atoms, which may be optionally substituted, $R^2$ and $R^3$ independently represent an alkyl, having 1 to 4 carbon atoms, which may be optionally substituted; or $R^x$ and $R^2$ or $R^x$ and $R^3$ are bound together to respectively form 1-alkanyl-ω-ylidene, having 2 to 9 carbon atoms, which may be optionally substituted; or $R^2$ and $R^3$ are bound together to form an alkylene, having 2 to 9 carbon atoms, which may be optionally substituted; or $R^2$ is methylidyne wherein one bond in the methylidyne is bound to $R^x$ to form 1-alkanyl-ω-ylidene, having 2 to 9 carbon atoms, which may be optionally substituted, and the other bond is bound to $R^3$ to form an alkylene, having 2 to 9 carbon atoms, which may be opt optionally substituted. By this reaction, a part or whole of hydroxyl groups in the vinylphenol unit is converted to a group corresponding to the group —OCH($R^1$)N($R^2$)COR$^3$ in the formula (I). This reaction is usually carried out in a solvent such as ethyl acetate, propylene glycol monomethyl ether acetate or methyl isobutyl ketone in the presence of an acid catalyst such as p-toluenesulfonic acid. Preferably, it is carried out by dissolving or dispersing a homopolymer or copolymer of vinylphenol in a solvent in the presence of an acid catalyst at a temperature of about 0 to 40° C.

In this reaction, when polyvinylphenol is used as the raw material and N-acyl unsaturated compound of the formula (III) is used in a quantity sufficient for converting total hydroxyl groups in the raw material to the group corresponding to the group —OCH($R^1$)N($R^2$)COR$^3$ in the formula (I), a polymer substantially consisting of the O-substituted vinylphenol units of the formula (I) alone can be obtained, if appropriate conditions are chosen. In another example, when the reaction is conducted using polyvinylphenol as the raw material, and N-acyl unsaturated compound of the formula (III) is reacted in a quantity less than the equivalent amount to the amount of hydroxyl group in the raw material, a copolymer constituted by the O-substituted vinylphenol units of the formula (I) and vinylphenol units can be obtained. In a further example, by using a copolymer of vinylphenol and another vinyl compound as the raw material, a binary or multi-unit copolymer having the units of the formula (I), units from the other vinyl compound and optionally vinylphenol units can be obtained. In these reaction modes, when plurality of N-acyl unsaturated compounds encompassed within the formula (III) are reacted in any desired order, a copolymer having plural kinds of unit within the limit of the formula (I) can be obtained.

When $R^x$ and $R^2$ in the above formula (III) are bound together to form 1-alkanyl-ω-ylidene, the compound of the formula (III) can specifically be represented by the following formula (IIIa). When $R^x$ and $R^3$ are bound together to form 1-alkanyl-ω-ylidene, the compound of the formula (III) can specifically be represented by the following formula (IIIb). When $R^2$ and $R^3$ are bound together to form an alkylene, the compound of the formula (III) can specifically be represented by the following formula (IIIc). When $R^2$ is methylidyne and one bond in the methylidyne is bound to $R^x$ to form 1-alkanyl-ω-ylidene and the other bond is bound to $R^3$ to form an alkylene, the compound of the formula (III) can specifically be represented by the following formula (IIId).

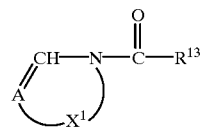
(IIIa)

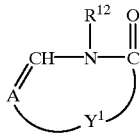
(IIIb)

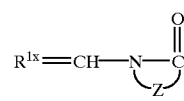
(IIIc)

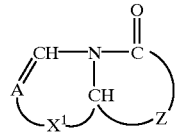
(IIId)

wherein $R^{1x}$ represents an alkylidene, having 1 to 4 carbon atoms, which may be optionally substituted; $R^{12}$, $R^{13}$ and Z are as defined above, A represents methylidyne which may be optionally substituted; and $X^1$ and $Y^1$ independently represent an alkylene, having 1 to 8 carbon atoms, which may be optionally substituted.

In the above formula (III), when $R^x$ is an alkylidene, having 1 to 4 carbon atoms, which may be optionally substituted, the alkylidene specifically includes methylene, ethylidene, propylidene, butylidene and the like. The 1-alkanyl-ω-ylidene groups having 2 to 9 carbon atoms represented by =A—$X^1$— in the formula (IIIa), =A—$Y^1$— in the formula (IIIb), or =A—$X^1$— in the formula (IIId) correspond respectively to X in the formula (Ia), Y in the formula (Ib) and X in the formula (Id). They may be a straight chain or a branched chain. Examples of groups which can be substituents on alkylidene represented by $R^k$ in the formula (III) or $R^{1x}$ in the formula (IIIc), methylidyne represented by A in the formulae (IIIa), (IIIb) and (IIId), and alkylene represented by $X^1$ and $Y^1$ in the formulae (IIIa), (IIIb) and (IIId) include the same groups exemplified as the substituents on $R^1$, X and Y. When the alkylene represented by $X^1$ or $Y^1$ in the formulae (IIIa), (IIIb) and (IIId) has 7 or less carbon atoms, the substituent on methylidyne represented by A in respective formulae may be an alkyl insofar as 1-alkanyl-ω-ylidene corresponding to =A—$X^1$— or =A—$Y^1$— has 9 or less carbon atoms.

Specific examples of the compounds of the formula (III) wherein $R^x$ is an alkylidene and $R^2$ and $R^3$ are alkyls include N-methyl-N-vinylacetamide. When this compound is reacted with a polymer having a vinylphenol unit, a polymer having 1-(N-acetyl-N-methylamino)ethoxystyrene unit represented by the following formula (a) can be obtained.

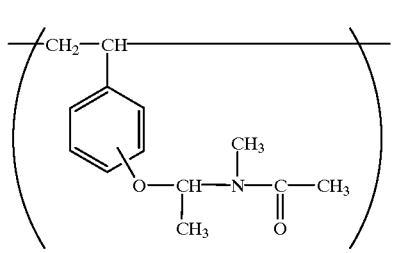

(a)

Specific examples of the compounds of the formula (III) wherein $R^x$ and $R^2$ in the formula (III) are bound together to form a compound of the formula (IIIa) include N-acetylpyrroline. When this compound is reacted with a polymer having a vinylphenol unit, a polymer having N-acetyl-2-pyrrolidinyloxystyrene unit, represented by the following formula (b), can be obtained.

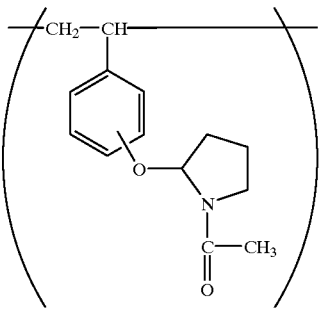

(b)

Specific examples of the compounds of the formula (III) wherein $R^x$ and $R^3$ are bound together to form a compound of the formula (IIIb) include N-methyl-3,4-dihydro-2-piperidone. When this compound is reacted with a polymer having a vinylphenol unit, a polymer having N-methyl-6-oxo-2-piperidyloxystyrene unit, represented by the following formula (c), can be obtained.

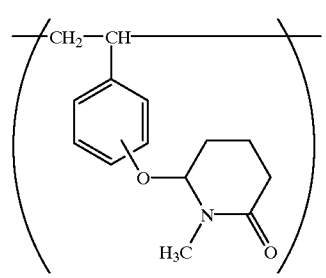

(c)

Specific examples of the compounds of the formula (III) wherein $R^2$ and $R^3$ are bound together to form a compound of the formula (IIIc) Include N-vinyl-2pyrrolidone, N-vinyl-2-piperidone and N-vinyl-2-vinylcaproiactam. When these compounds are reacted with a polymer having a vinylphenol unit, a polymer having 1-(2-oxo1-pyrrolidinyl)ethoxystyrene unit, represented by the following formula (d), a polymer having 1-(2-oxopiperldino)ethoxystyrene unit, represented by the following formula (e), and a polymer having 1-(2-oxo-1-perhydroazepinyl)ethoxystyrene unit, represented by the following formula (f), can be obtained.

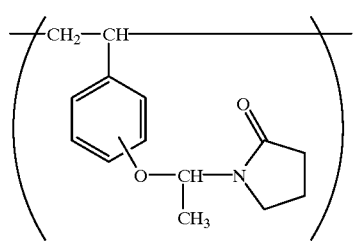

(d)

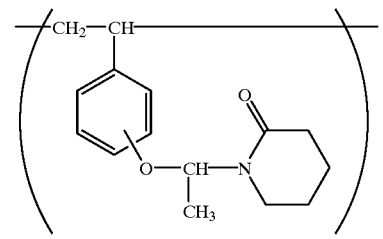

(e)

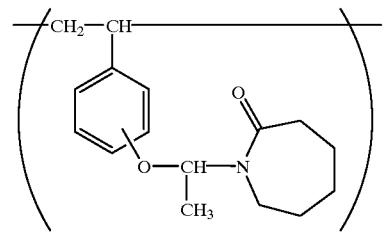

(f)

Furthermore, specific examples of the compounds of the formula (III) wherein $R^2$ is methylidyne, one bond in the methylidyne is bound to $R^x$ and the other bond is bound to $R^3$ to form a compound of the formula (IIId) include 1-azabicyclo[3.3.0]octa-2-ene-8-one. When this compound is reacted with a polymer having a vinylphenol unit, a polymer having 1-aza-8-oxobicyclo[3.3.0]octane-2-yloxystyrene unit, represented by the following formula (g), can be obtained.

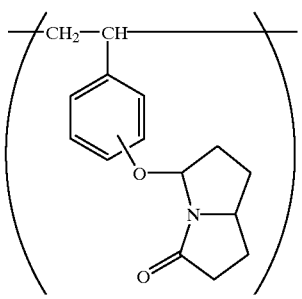

(g)

Various polymers having an O-substituted vinylphenol unit encompassed in the above formula (I) can be produced in the above-described manner. It is preferred that the polymers have a weight average molecular weight in a range of about 2.000 to 32,000. In addition, it is preferred that the polymer have a molecular weight distribution represented by the ratio of the weight average molecular weight (Mw) and the number average molecular weight (Mn), i.e. (Mw/Mn), in a range of about 1.01 to 2.0. The weight average molecular weight and the number average molecular weight herein refer to values measured by gel permeation chromatography (GPC) using polystyrene as the standard.

The polymer having an O-substituted vinylphenol unit of the formula (I) according to the present invention is useful as resin component for the resist composition. Therefore, the resist composition of the present invention comprises the polymer having an O-substituted vinylphenol unit as a resin component. As the resin component, it is possible to use, in admixture, another polymer in addition to the polymer having an O-substituted vinylphenol unit of the formula (I). Examples of said another polymer usable together with the polymer having an O-substituted vinylphenol unit of the formula (I) include novolak resins and a homopolymer or copolymers produced from various vinyl compounds exemplified before as monomers for introducing other units possibly present together with the unit of the formula (I). For example, polyvinylphenol, partly alkyl-etherized products thereof and the like can be the polymer usable with the polymer having an O-substituted vinylphenol unit of the formula (I).

The O-substituted vinylphenol unit of the formula (I) exerts a significant effect even at a small amount. For example, when the polymer having this unit is combined with another polymer as the resin components, the O-substituted vinylphenol unit of the formula (I) is preferably present in 0.1% by mole or more based on the total resin component. In order to be more effective, the O-substituted vinylphenol unit of the formula (I) is preferably present in 0.5% by mole or more based on the total resin component.

In resist compositions of the alkali-developing type, the resin contained therein usually has an alkali-soluble functional group. In the polymer having the vinylphenol unit together with the O-substituted vinylphenol unit of the formula (I). The hydroxyphenyl group in the vinylphenol unit plays as the alkali-soluble functional group. When polyvinylphenol or a partly modified product thereof such as a partly alkyl-etheriaed product is used as the resin component, the hydroxyphenyl group in polyvinylphenol or a partly modified product thereof contributes to the solubility in alkali.

The chemical amplification type resist compositions usually contain a compound which is capable of generating an acid upon irradiation of a high-energy radiation to said composition, so-called acid generator. When the resist composition of the present invention is used as a chemical amplification type resist, it is preferred that the composition contains an acid generator. The high-energy radiation herein refers to electromagnetic waves and beams which are capable of causing a chemical reaction when act on a molecule. Examples thereof include g-ray (wave length: 468 nm), i-ray (wave length: 365 nm), KrF eximer light (wave length: 248 nm), ArF eximer light (wave length: 198 nm), X-ray, electronic rays and ion beams.

Examples of the acid generator include iodonium salt compounds, sulfonium salt compounds, organic halogen compounds, particularly haloalkyl-s-triazine compounds, sulfonate compounds, disulfone compounds, diazomethane compounds and N-sulfonyloxyimide compounds. Compounds in this category can be used singly or in admixture of two or more, if necessary. More specifically, compounds listed below can be used as the acid generator:

(1) Iodonium compounds:
  diphenyliodonium trifluoromethanesulfonate,
  4-methoxyphenylphanyliodonium hexafluoroantimonate,
  4-methoxyphanylphenyllodonium trifluoromethanesulfonate,
  bis(4-tert-butylphonyl)iodonium tetrafluoroborate,
  bis(4-tert-butylphenyl)iodonium hexafluorophosphate,
  bis(4-tert-butylphenyl)iodonium hexafluozoantimonate,
  bis(4-tert-butylphenyl)iodonium trifluoromethanesulfonate,
  bis(4-tert-butylphenyl)iodonium 10-camphorsulfonate,
  bis(4-tert-butylphenyl)iodonium p-toluenesulfonate, and the like (2) Sulfonium salt compounds:
  triphenylsulfonium hexafluorophosphate,
  triphenylsulfonium hexafluoroantimonate,
  triphenylsulfonium trifluoromethanesulfonate,
  4-methoxyphenyldiphenylsulfonium hexafluoroantimonate,
  4-methoxyphenyldiphenylsulfonium trifluoromethanesulfonate,
  4-methylphenyldiphenylsulfonium methanesulfonate,
  p-tolyldiphenylsulfonium trifluoromethanesulfonate,
  2,4,6-trimethylphenyldiphenylsulfonium trifluoromethanesulfonate,
  4-tert-butylphenyldiphenylsulfonium trifluoromethanesulfonate,
  4-phenylthiophenyldiphenylsulfonium hexafluorophosphate,
  4-phenylthiophenyldlphenylsulfonium hexafluoroantimonate,
  1-(2-naphthoylmethyl)thioranium hexafluoroantimonate,
  1-(2-naphthoylmethyl)thioranium trifluoromethanesulfonate,
  4-hydroxy-1-naphthyldimethylsulfonium hexafluoroantlmonate,
  4-hydroxy-1-napbthyldimethylsulfonium trifluoromethanesulfonate, and the like.

(3) Organic halogen compounds:
  2-methyl-4,6-bis(trichloromethyl)-1,3,5-triazine,
  2,4,6-tris(trichloromethyl)-1,3,5-triazine,
  2-phenyl-4,6-bis(trichloromethyl)-1,3,5-triazine,
  2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzoyl[d][1,3]dioxolane-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-dimethoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine, 2-(4-penttyloxystyryl)-4,6-bis(trichloromethyl)-1,3,5-triazine, and the like.

(4) Sulfonate compounds:

1-benzoyl-1-phenylmethyl p-toluenesulfonate (common name: benzoin tosilate), 2-benzoyl-2-hydroxy-2-phenylethyl p-toluenesulfonate (common name: α-methylolbenzoin tosilate), 1,2,3-benzenetrlyl trismethanesulfonate, 2,6-dinitrobenzyl p-toluenesulfonate, 2-nitrobenzyl p-toluenesulfonate, 4-nitrobenzyl p-tolueneaulfonate, and the like.

(5) Disulfone compounds:

diphenyl disulfone.

di-p-tolyl disulfone, and the like.

(6) Diazomethane compounds:

bis(phenylsulfonyl)diazomethane, bis(4-chlorophenylsultonyl)diazomethane, bis(p-tolylsulfonyl)diazomethane, bis(4-tert-butylphenylsulfonyl)diazomethane, bis(2,4-xylylsulfonyl)diazomethane, bis(cyclohexylsulfonyl)diazomethane, bis(tert-butylsulfonyl)diazomethane, (benzoyl)(phenylsulfonyl)diazomethane, and the like.

(7) N-sulfonyloxyimide compounds:

N-(ethylsulfonyloxy)succinimide,

N-(isopropylsulfonyloxy)succinimide,

N-(butylsulfonyloxy)succinimide,

N-(10-camphorsulfonyloxy)succinimide,

N-(phenylsulfonyloxy)succinimide,

N-(trifluoromethylsulfonyloxy)succinimide,

N-(trifluoromethylsulfonyloxy)phthalimide,

N-(trifluoromethylsulfonyloxy)-5-norbornene-2,3-dicarboxyimide,

N-(trifluoromethylsulfonyloxy)naphthalimimde,

N-(10-camphorsulfonyloxy)naphthalimide, and the like.

Among them, preferred acid generators to be used in combination with the polymer defined in the present invention include bis(4-tert-butylphenyl)iodonium 10-camphorsulfonate, bis(4-tert-butylphenyl)iodonium p-toluenesulfonate, 4-methylphenyldiphenylsulfonium methanesulfonate, 4-methylphenyldiphenylsulfonium trifluoromethanesulfonate, bis(tert-butylsulfonyl) diazomethane, bis(cyclohexylsulfonyl)diazomethane, bis(p-tolylsulfonyl)diazomethane, N-(ethylsulfonyloxy)succinimide, N-(isopropylsulfonyloxy)succinimide, N-(butylsulfonyloxy)succinimide, N-(10-camphorsulfonyloxy)succinimide, and the like.

In the lithography using a chemical amplification type resist composition, post-exposure baking is generally carried out, in order to promote a chain chemical reaction using an acid generated by light-exposure as a catalyst. It is known that, when the period from the light-exposure to the post-exposure baking is prolonged, the deterioration in performance is caused by inactivation of the acid. In addition, due to undesirable diffusion of the generated acid to an unexposed part in the resist film and the extension of the chemical reaction even to the unexposed part, the performance such as a shape of pattern is sometimes deteriorated. It is known that, in order to prevent deterioration in performance due to inactivation of the acid caused by standing after the light-exposure, or in order to control diffusion of the acid and inhibit the reaction in the unexposed part, addition of a small amount of a basic compound, particularly a basic nitrogen-containing organic compound, for example an amine compound, as a quencher is effective. It is preferred that the chemical amplification type resist composition of the present invention contains such a basic nitrogen-containing organic compound as a quencher in addition to an acid generator.

The nitrogen-containing organic compound used as a quencher may be primary amines, secondary amines, tertiary amines, unsaturated cyclic amines, quaternary ammonium salts and the like, and more specifically, exemplified by the following compounds:

(8) Primary amines:

hexylamine, heptylamine, octylamine, nonylamine, decylamine, aniline, 2-, 3- or 4-methylaniline, 4-nitroaniline, 1- or 2-naphthylamine, ethylenediamine, tetramethylenediamine, hexamethylenediamine, 4,4'-diamino-1,2-diphenylethane, 4,4'-diamino3,3'-dimethyldiphenylmethane, 4,4'-diamino-3,3'-dimethyldiphenylmethane, and the like.

(9) Secondary amines:

dibutylamine, dipentylamine, dihexylamine, diheptylamine. dioctylamlne, dinonylamine, didecylamine, N-methylantline, plperidine, diphenylamine, and the like.

(10) Tertiary amines:

triethylamine, trimethylamine, tripropylamine, tributylamine, tripentylamine, trihexylamine, triheptylamine, trioctylamine, trinonylamine, tridecylamine, methyldibutylanine, methyldipentylamine, methyldihexylamine, methyldicyclohexylamine, methyldiheptylamine, methyldioctylamine, methyldlnonylamine, methyldldecylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, triisopropanolamine, N,N-dimethylaniline, and the like.

(11) Unsaturated cyclic amines:

imidazole, pyridine, 4-methylpyridine, 4-methylimidazole, bipyridine, 2,2'-dipyridylamine, di-2-pyridylketone, 1,2-di(2-pyridyl)ethane, 1,2-di(4-pyridyl)ethane, 1,3-di(4-pyridyl)propane, 1,2-di(2-pyridyl)ethylene, 1,2-di(4-pyridyl)ethylene, 1,2-bis(4-pyridyloxy)ethane, 4,4'-dipyrldylsulfide, 4,4'-dipyridyldisulfide, 2,2'-dipicolylamine, 3,3'- dipicolylamine, and the like. p0 (12) Quaternary ammonium salts:

tetraisopropyl ammonium hydroxide, tetrabutyl ammonium hydroxide, and the like.

Among them preferred are unsaturated cyclic amines, particularly, bipyridine, 2,2'-dipyridylamine, di-2-pyridylketone, 1,2-di(2-pyridyl)ethane, 1,2-di(4-pyridyl)ethane, 1,3-di(4-pyridyl)propane, 1,2-di(2-pyridyl)ethylene, 1,2-di(4-pyridyl)ethylene, 4,4'-dipyrldylsulfide, 4,4'-dipyridyldisulfide, 2,2'-dipicolylamine, 3,3'-dipicolylamine, and the like. In addition, the basic nitrogen-containing organic compounds used as quenchers are preferably compounds which are hardly evaporated at a temperature for pre-baking, and more specifically, compounds having a boiling point of 150° C. or above, so that they remain in a resist film after pre-baking the resist film formed on a substrate and exhibit the effect.

By adding a cross-linking agent, the resist composition of the present invention can be made as a negatively working resist compositions. The cross-linking agent herein refers to a compound which has an action of cross-linking a resin component by the action of an acid. As the cross-linking agent, compounds having a methylol group or alkyl ethers thereof are preferred. Examples thereof include compounds disclosed in JP-A-1-293339 and JP-A-5-210239. Among them, preferred cross-linking agents are hexamethoxymethylmelamine of the following formula (h), tetramethoxymethylbenzoguanamlne of the following formula (i), tetramethoxymethylglyoxaldluraine of the following formula (j), and the like.

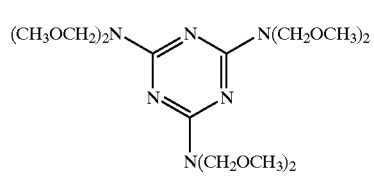

(h)

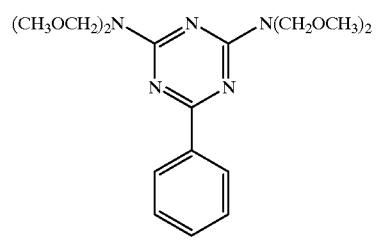

(i)

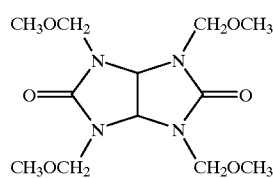

(j)

The resist composition of the present invention is advantageous particularly when it contains an acid generator and is used as that of chemical amplification type. In this case, it is preferred that the composition contains an acid generator within a range of 0.1 to 20% by weight based on the total solid weight. It is preferred that the composition contains a resin component having an O-substituted vinylphenol unit of the formula (I) in an amount of 70% by weight or more based on the total solid weight. For example, when the resist composition comprises, as the principal components, a resin component and an acid generator, the composition preferably contains the resin component within a range of 80 to 99.9% by weight and the acid generator within a range of 0.1 to 20% by weight. When a quencher is comprised, it is preferably used within a range of 0.0001 to 1% by weight based on the total solid weight. In addition, when a cross-linking agent is comprised for use as a negative working resist, the composition preferably comprises the resin component within a range of 70 to 99.9% by weight, the acid generator within a range of 0.1 to 20% by weight and the cross-linking agent within a range of 1 to 30% by weight based on the total solid weight. The resist composition of the present invention may further comprise, if necessary, a small amount of various additives such as sensitizer, solubilizing inhibitor, surfactant, stabilizer and dye.

The resist composition is usually prepared by mixing respective components described above with a solvent to form a resist solution so that the total solid content therein is 10 to 50% by weight. The resist solution is coated onto a substrate such as a silicon wafer according to a usual manner such as spin coating. The solvent used herein may be anyone that can dissolve the components and has an appropriate drying rate. Such a solvent can be one usually used in this field. Examples thereof include glycol ether esters such as ethyl cellosolve acetate, methyl cellosolve acetate, propylene glycol monomethyl ether acetate and propylene glycol monoethyl ether acetate; glycol mono- or di-ethers such as ethyl cellosolve, methyl cellosolve, propylene glycol monomethyl ether, propylene glycol monoethyl ether and diethylene glycol dimethyl ether; esters such as ethyl lactate, butyl acetate, amyl acetate; ethyl pyruvate and γ-butyrolactone; ketones such as 2-heptanone, cyclohexanone and methyl isobutyl ketone; aromatic hydrocarbons such as xylene; and lactams such as N-methyl-2-pyrrolidone. These solvents may be used singly or as a mixture of two or more.

The resist composition of the present invention can be used, for example, in the following manner: A resist solution obtained by dissolving components into a solvent as described above is coated on a substrate. The coated substrate is dried (pre-baked) and subjected to exposure for patterning. Then, it is subjected to heat treatment for promoting chemical reaction and then developed with an alkaline developer to form a resist pattern. The alkaline developer used here may be anyone used in this field. Examples thereof include 1 to 10% aqueous solution of tetramethyl ammonium hydroxide or (2-hydroxyethyl)trimethyl ammonium hydroxide (common name: choline). A water-soluble organic solvent such as methanol or ethanol and a surfactant of a certain kind can be added to the aqueous alkali solution in an appropriate amount.

The present invention will now be described in more detail based on Examples, which by no means should be construed as a limitation upon the scope of the present invention. In Examples, parts are weight based unless otherwise specified.

EXAMPLE 1

Production of poly[p-hydroxystyrene/p-(1-(2-oxo-1-pyrrolidinyl)ethoxy)styrene]

Into 200 parts of propylene glycol monomethyl ether acetate was dissolved 50.0 parts of poly(p-vinylphenol) ["VP-2500", manufactured by Nippon Soda, having a weight average molecular weight of 4,000 and a distribution of 1.15]. The solution was cooled to room temperature and a catalytic amount of p-toluenesulfonic acid was added thereto and dissolved. To this solution was added dropwise 4.63 parts of N-vinyl-2-pyrrolidone over 30 minutes. Then the solution was kept at room temperature for 2 hours. After adding methyl isobutyl ketone, the solution was washed with ion-exchanged water. The organic layer after washing was concentrated to 250 parts, combined with 250 parts of propylene glycol monomethyl ether acetate and further concentrated to 124 parts. The solid content of the concentrate measured by weight-loss on heating was 39.65% by weight. A broad peak at 6.0 ppm was confirmed by $^1$H-NMR [270 MHz, in (dimethylsulfoxide)-$d_6$] and assigned to the methine proton in —O—CH(CH$_3$)—N<. From the ratio of integrated area for this methine proton and that for the aromatic protons, it was confirmed that the resin was a copolymer constituted by p-hydroxystyrene unit and p-[1-(2-oxo-1-pyrrolidinyl)ethoxy]styrene in a ratio of 91:9. The resin was referred to as Resin R1.

Reference Example 1

Production of poly(p-hydroxystyrene/p-isopropoxystyrene)

Into a reaction vessel were charged 30.0 parts of the same poly(p-vinylphenol) as that used in Example 1 and 120 parts of acetone. They were stirred to form a solution. Additionally charged were 29.6 parts of anhydrous potassium carbonate and 18.2 parts of isopropyl iodide. The temperature was elevated so that the mixture reached to the lo reflux state. Subsequently, the reflux state was kept for 27 hours. After adding methyl isobutyl ketone, the solution was washed with aqueous oxalic acid solution and then with ion-exchanged water. The organic layer after washing was concentrated to 71 parts, combined with 206 parts of propylene glycol monomethyl ether acetate and further concentrated to 88.6 parts. The solid content of the concentrate measured by weight-loss on heating was 31.92% by weight. By $^1$H-NMR measurement, it was confirmed that the resin after reaction was a copolymer In which 31.4% of hydroxyl groups in poly(p-vinylphenol) was converted to isopropyl ether. The resin was referred to as Resin RA.

Reference Example 2

Production of poly(p-hydroxystyrene/p-ethoxystyrene)

Into a reaction vessel were charged 21.0 parts of the same poly(p-vinylphenol) as that used in Example 1 and 84 parts of acetone. They were stirred to form a solution Additionally charged were 12.7 parts of anhydrous potassium carbonate and 8.2 parts of ethyl iodide. The temperature was elevated so that the mixture reached to the reflux state. Subsequently, the reflux state was kept for 15 hours After adding methyl isobutyl ketone, the solution was washed with aqueous oxalic acid solution and then with ion-exchanged water. The organic layer after washing was concentrated to 44 parts, combined with 130 parts of propylene glycol monomethyl ether acetate and further concentrated to 63 parts. The solid content of the concentrate measured by weight-loss on heating was 34.19% by weight. By $^1$H-NMR measurement. it was confirmed that the resin after reaction was a copolymer in which 28.8% of hydroxyl groups in poly(p-vinylphenol) was converted to ethyl ether. The resin was referred to as Resin RB.

Reference Example 3

Production of poly(p-hydroxystyrene/p-ethoxystyrene)

The procedure in Reference Example 2 was repeated except that the amount of anhydrous potassium carbonate was 15.5 parts and that of ethyl iodide was 10.9 parts. The concentration of the organic layer after washing with ion-exchanged water was carried out to attain 45 parts, and the concentration after adding propylene glycol monomethyl ether acetate was carried out to attain 68 parts. As the result, a solution in which the solid content of the concentrate measured by weight-loss on heating was 27.45% by weight was obtained. By $^1$H-NMR measurement, it was confirmed that the resin was a copolymer in which 37.8% of hydroxyl groups in poly(p-vinylphenol) was converted to ethyl ether. The resin was referred to as Resin RC.

EXAMPLE 2

Production of poly[p-hydroxystyrene/p-{1-(N-acetyl-N-methylamino)ethoxy}styrene]

The procedure in Example 1 was repeated except that 4.95 parts of N-vinyl-N-methylacetamide were used in place of N-vinyl-2-pyrrolidone to give a resin solution. The solid content of the resin solution measured by weight-loss on heating was 26.34% by weight. A broad peak at 2.7 ppm was confirmed by $^1$H-NMR [270 MHz, in (dimethylsulfoxide)-$d_6$] and assigned to the N-methyl proton. From the ratio of integrated area for this methyl proton and that for the aromatic protons, it was confirmed that the resin was a copolymer constituted of p-hydroxystyrene unit and p-[1-(N-acetyl-N-methylamino)ethoxy]styrene in a ratio of 94:6. The resin was referred to as Resin R2.

EXAMPLE 3

Production of poly[p-hydroxystyrene/p-{1-(2-poxo-1-perhydroazepinyl)ethoxy}styrene]

The procedure in Example 1 was repeated except that a solution of 6.95 parts of N-vinylcaprolactam dissolved in 27.8 parts of propylene glycol monomethyl ether acetate was used In place of N-vinyl-2-pyrrolidone to give a resin solution. The solid content of the resin solution measured by weight-loss on heating was 30.61% by weight. A broad peak at 175 ppm was confirmed by $^{13}$C-NMR [270 MHz, in (dimethylsulfoxide)-$d_6$] and assigned to the carbonyl carbon atom. From the ratio of integrated area for this carbonyl carbon atom and that for the aromatic carbons, it was confirmed that the resin was a copolymer constituted by p-hydroxystyrene unit and p-[1-(2-oxo-1-perhydroazepinyl) ethoxy]styrene in a ratio of 90:10. The resin was referred to as Resin R3.

EXAMPLE 4

Production of poly[p-hydroxystyrene/p-isopropoxystyrene/p-{1-(2-oxo-1-pyrrolidinyl) ethoxy}styrene]

The procedure in Example 1 was repeated except that 50.0 parts expressed in the solid content of a resin solution produced by the same procedure to that in Reference Example 1 was used in place of poly(p-vinylphenol) and the amount of N-vinyl-2-pyrrolidone was changed to 5.03 parts to give a resin solution. The solid content of the resin solution measured by weight-loss on heating was 30.14% by weight. By $^1$H-NNR measurement, it was confirmed that the resin was a copolymer constituted by p-hydroxystyrene unit, p-isopropoxystyrene unit and p-[1-(2-oxo-1-pyrrolidinyl) ethoxy]styrenein a ratio of 61:30:9. The resin was referred to as Resin R4.

EXAMPLE 5

Production of poly[p-hydroxystyrene/styrene/p-{1-(2-oxo-1-pyrrolidinyl)ethoxy}styrene]

The procedure in Example 1 was repeated except that 59.0 parts of a copolymer, produced by the living anion polymerization, having p-hydroxystyrene unit and styrene unit in a ratio of 85:15 (weight average molecular weight: 4,200 and distribution: 1.09) was used in place of poly(p-vinylphenol) and the amount of N-vinyl-2-pyrrolidone was changed to 10.38 parts to give a resin solution. The solid content of the resin solution measured by weight-loss on heating was 30.93% by weight. By $^1$H-NMR measurement, it was confirmed that the resin was a copolymer constituted by p-hydroxystyrene unit. styrene unit and p-[1-(2-oxo-1-pyrrolidinyl)ethoxy]styrene in a ratio of 70:15:15. The resin was referred to as Resin R5.

EXAMPLE 6

Production of poly[p-hydroxystyrene/p-(1-ethoxyethoxy)styrene/p-{1-(2-oxo-1-pyrrolidinyl)ethoxy}styrene/tert-butyl methacrylate]

Into 120 parts of propylene glycol monomethyl ether acetate was dissolved 30.0 parts of a copolymer, produced by the radical polymerization, having p-hydroxystyrene unit and a unit of tert-butyl methacrylate in a ratio of 90 10 (weight average molecular weight: 18,500 and distribution: 1.85). The solution was cooled to room temperature and a catalytic amount of p-toluenesulfonic acid was added thereto and dissolved. To this solution was added dropwise 8.71 parts of ethyl vinyl ether over 30 minutes and the solution was kept at room temperature for 3 hours. Then, 3.31 parts of N-vinyl-2-pyrrolidone was added dropwise over 30 minutes and the solution was subsequently kept at room temperature for 3 hours. After adding methyl isobutyl ketone, the solution was washed with ion-exchanged water. The organic layer after washing was concentrated to 76 parts, combined with 150 parts of propylene glycol monomethyl ether acetate and further concentrated to 110 parts. The solid content of the concentrate measured by weight-loss on heating was 31.38% by weight. A broad peak at 6.0 ppm was confirmed by $^1$H-NMR [270 MHz, in (dimethylsulfoxide)-$d_6$] and assigned to the methine proton in —O—CH(CH$_3$)—N<. Another broad peak at 5.3 ppm was confirmed and assigned to the methine proton in 1-ethoxyethyl group. From the ratio of integrated area for these methane protons and that for the aromatic protons, it was confirmed that the resin was a copolymer constituted by p-hydroxystyrene unit, p-(1-ethoxyethoxy)styrene unit, p-[1-(2-oxo-1-pyrrolidinyl)ethoxy]styrene unit and tert-butyl methacrylate in a ratio of 34:47:9:10. The copolymer has a group which can be eliminated by the action of an acid and becomes alkali-soluble after the elimination. Therefore, it is can be used as a resin for the positive working resist.

The following Examples illustrate the use of the resins obtained in the above Examples and Reference Examples in the production of resist compositions and the evaluation of the produced resist compositions.

EXAMPLE 7

Into 550 parts of propylene glycol monomethyl ether acetate, including portions derived from the resin solution, were mixed and dissolved 43.5 parts converted to the solid of the resin R1 obtained in Example 1, 56.5 parts converted to the solid of the resin RA obtained in Reference Example 1, 5.0 parts of hexamethoxymethylmelamine as a crosslinking agent, 11.0 parts of N-(isopropylsulfonyloxy)succinimide as an acid generator and 0.15 part of 1.3-di(4-pyridyl)propane as a quencher. The solution was filtered through a filter of fluorine resin having a pore size of 0.1 μm to give resist solutions.

An organic reflection-preventing membrane having a thickness of 60 nm was placed on a silicon wafer washed according to the conventional method. The resist solution obtained above was coated on said wafer with a spin coater. Then the silicon wafer was pre-baked on a hotplate at 100° C. for 60 seconds so that a resist film having a thickness of 0.52 μm is formed. The film after pre-baking was irradiated with a KrF eximer laser stepper ["NSR-2205 EX12B", manufactured by Nikon, NA=0.551] having an exposure wavelength of 248 nm through a chromium mask having a line-and-space pattern, changing stepwise the exposure amount. The exposed wafer was heated on a hot plate at 105° C. for 60 seconds (post-exposure baking) Then the wafer was developed with 2.38% aqueous tetramethyl ammonium hydroxide solution to give a negative pattern.

The obtained pattern was assessed by an electron microscope and the light-exposure amount which gave a 0.20 μm line-and-space cross section of 1:1 (effective sensitivity) was measured. The result was 55 mJ/cm$^2$. The minimum width of line-and-space splitting without loss of the film thickness by a light exposure at the effective sensitivity (resolution) was 0.16 μm.

EXAMPLES 8–18

Resist solutions were prepared and assessed in the same manner to that in Example 7 except that the kind and amount of the resin, the kind and amount of the quencher, and the amount of propylene glycol monomethyl ether acetate as the solvent were changed as shown in Table 1. The results are shown in Table 1 together with the change in the composition from Example 7. In Table 1, symbols that are not defined before have the following meaning:

Resin RD: a copolymer, produced by the living anion polymerization, having p-hydroxystyrene unit and styrene unit in a ratio of 70:30 (weight average molecular weight: 4,300 and distribution: 1.07).

Resin PVP: poly(p-vinylphenol) ["VP-2500", manufactured by Nippon Soda, having a weight average molecular weight of 4,000 and a distribution of 1.15].

Quencher Qi: 1.3-di(4-pyridyl)propane.

Quencher Q2: 4,4'-diamino-3,3'-diethyldiphanylmethane.

TABLE 1

| Example No. | First resin (part) | Second resin (part) | Quencher (part) | Solvent (part) | Effective sensitivity | Resolution μm |
|---|---|---|---|---|---|---|
| 7 | R1/43.5 | RA/56.5 | Q1/0.15 | 550 | 55 mJ/cm$^2$ | 0.16 |
| 8 | R1/41.5 | RA/58.5 | Q1/0.11 | 550 | 38 mJ/cm$^2$ | 0.17 |
| 9 | R1/37.5 | RA/62.5 | Q1/0.11 | 550 | 34 mJ/cm$^2$ | 0.17 |
| 10 | R1/52.0 | RB/48.0 | Q1/0.11 | 550 | 56 mJ/cm$^2$ | 0.16 |
| 11 | R1/43.5 | RC/56.5 | Q1/0.11 | 550 | 34 mJ/cm$^2$ | 0.17 |
| 12 | R1/40.0 | RD/60.0 | Q1/0.15 | 550 | 57 mJ/cm$^2$ | 0.16 |
| 13 | R2/40.0 | RA/60.0 | Q1/0.10 | 575 | 37 mJ/cm$^2$ | 0.17 |
| 14 | R3/47.7 | RA/52.3 | Q1/0.10 | 575 | 32 mJ/cm$^2$ | 0.18 |
| 15 | R1/57.5 | R4/42.5 | Q1/0.15 | 550 | 65 mJ/cm$^2$ | 0.16 |
| 16 | R1/57.5 | R4/42.5 | Q2/0.15 | 550 | 29 mJ/cm$^2$ | 0.17 |

TABLE 1-continued

| Example No. | First resin (part) | Second resin (part) | Quencher (part) | Solvent (part) | Effective sensitivity | Resolution μm |
|---|---|---|---|---|---|---|
| 17 | R5/67.8 | PVP/32.2 | Q1/0.15 | 550 | 78 mJ/cm² | 0.16 |
| 18 | R5/84.7 | PVP/15.3 | Q1/0.15 | 550 | 62 mJ/cm² | 0.17 |

All the negative patterns obtained in the above Examples 7–18 had a good profile (pattern shape) and a vertical wall. In addition, all the compositions had less change in performance upon a long-term storage. Further, when the time from the end of pre-baking to the exposure was prolonged by 24 hours, almost no change was observed in effective sensitivity and resolution.

According to the present invention, a novel polymer which is useful as a resin component for the resist composition is provided. The resist composition containing such a polymer as the resin component gives an excellent resolution and profile, and gives good results for the sensitivity, retention of the film thickness and the coating property. In addition, the resist composition is excellent in storage stability as the resist solution and, after coating on a substrate, even if the time from the pre-baking to the light-exposure is changed, the performance is hardly changed. Furthermore, the composition is suitable for light-exposure with g-ray (wave length: 468 nm), i-ray (wave length: 365 nm), KrF eximer light (wave length: 248 nm), ArF eximer light (wave length: 198 nm), X-ray, electronic beams, ion beams and so on and. In the eximer laser lithography process using these light source, it enables improvement in resolution and contrast and also formation of a fine resist pattern with a high accuracy.

What is claimed is:

1. A polymer having an O-substituted vinylphenol unit represented by the following formula (I)

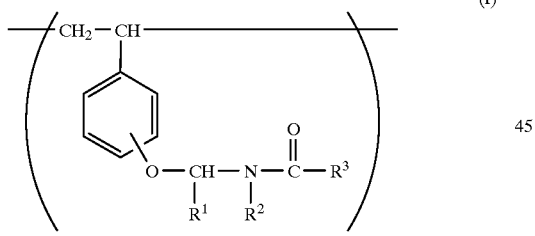

(I)

wherein $R^1$, $R^2$ and $R^3$ independently represent an alkyl, having 1 to 4 carbon atoms, which may be optionally substituted; or $R^1$ and $R^2$, $R^1$ and $R^3$ or $R^2$ and $R^3$ are bound together and respectively form an alkylene, having 2 to 9 carbon atoms, which may be optionally substituted; or $R^2$ is methylidyne wherein one bond in the methylidyne is bound to $R^1$, the other bond is bound to $R^3$, and $R^1$ and $R^3$ independently represent alkylene, having 2 to 9 carbon atoms, which may be optionally substituted.

2. The polymer according to claim 1, wherein the group $-OCH(R^1)N(R^2)COR^3$ is bound to p-position in benzene ring which is a pendant on the main chain of the polymer.

3. The polymer according to claim 1, wherein $R^1$ is an alkyl, having 1 to 4 carbon atoms, which may be optionally substituted, and $R^2$ and $R^3$ are bound together and form an alkylene, having 2 to 9 carbon atoms, which may be optionally substituted.

4. The polymer according to claim 1, wherein $R^1$, $R^2$ and $R^3$ independently represent an alkyl, having 1 to 4 carbon atoms, which may be optionally substituted.

5. The polymer according to claim 1, wherein the O-substituted vinylphenol unit represented by the formula (I) is represented by one of the following formulae (Ia), (Ib), (Ic) and (Id):

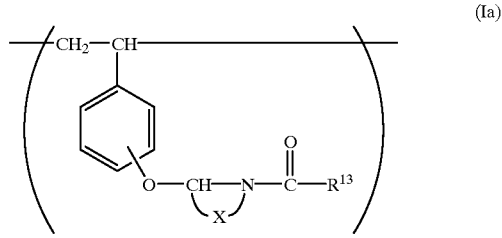

(Ia)

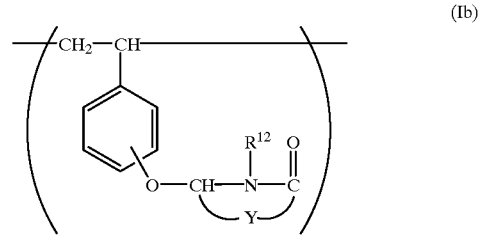

(Ib)

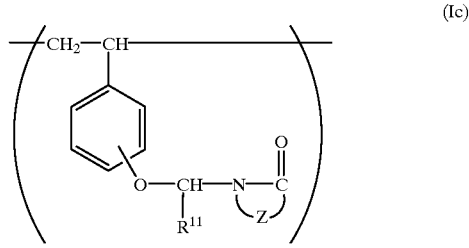

(Ic)

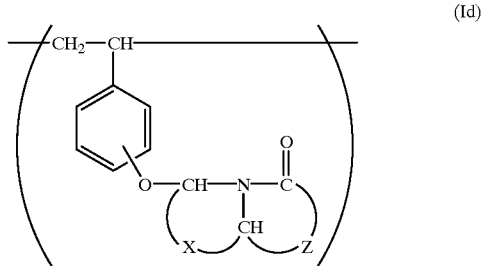

(Id)

wherein $R^{11}$, $R^{12}$ and $R^{13}$ independently represent an alkyl, having 1 to 4 carbon atoms, which may be optionally substituted; and X, Y and Z independently represent an alkylene, having 2 to 9 carbon atoms, which may be optionally substituted.

6. The polymer according to claim 5, wherein $R^{11}$, $R^{12}$ and $R^{13}$ independently represent an alkyl, having 1 to 4 carbon atoms, which is unsubstituted or substituted with alkoxy having 1 to 4 carbon atoms, alkoxycarbonyl wherein its alkyl part has 1 to 4 carbon atoms, acyl having 1 to 5 carbon atoms in total, and acyloxy having 1 to 5 carbon atoms in total; and X, Y and Z independently represent an alkylene, having 2 to 9 carbon atoms, which is unsubstituted or substituted with alkoxy having 1 to 4 carbon atoms, alkoxycarbonyl wherein its alkyl part has 1 to 4 carbon atoms, acyl having 1 to 5 carbon atoms in total, and acyloxy having 1 to 5 carbon atoms in total.

7. The polymer according to claim 5, wherein $R^{11}$, $R^{12}$ and $R^{13}$ independently represent an alkyl having 1 to 4 carbon atoms; and X, Y and Z independently represent trimethylene, tetramethylene or pentamethylene.

8. The polymer according to claim 1, which further has a unit derived from a vinyl compound.

9. The polymer according to claim 8, wherein the unit derived from a vinyl compound is a vinyl phenol unit represented by the following formula:

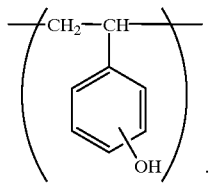
(II)

10. The polymer according to claim 9, wherein the vinyl phenol unit is derived from p-vinyl phenol.

11. A polymer which has a unit represented by the following formula (Ic) and a unit represented by the following formula (II):

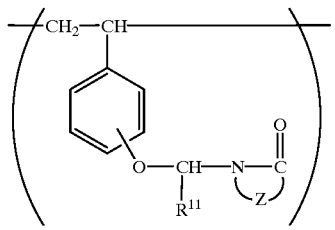
(Ic)

-continued

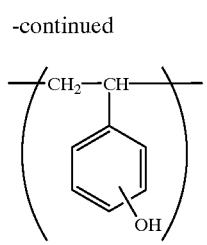
(II)

wherein $R^{11}$ represent an alkyl, having 1 to 4 carbon atoms, which may be optionally substituted; and Z represent an alkylene, having 2 to 9 carbon atoms, which may be optionally substituted.

12. A resist composition which comprises the polymer according to claim 1, as the resin component.

13. The resist composition according to claim 12, which further comprises a polymer not having the unit represented by the formula (I).

14. The resist composition according to claim 13, wherein the polymer not having the unit represented by the formula (I) is polyvinyl phenol or a partially alkyl etherified polyvinyl phenol.

15. The resist composition according to claim 12, which further comprises an acid generator.

16. The resist composition according to claim 12, which further comprises an amine compound as a quencher.

17. The resist composition according to claim 12, which further comprises a cross-linking agent which cross-links the resin component by the action of acid.

* * * * *